United States Patent
Oh et al.

(10) Patent No.: US 8,599,355 B2
(45) Date of Patent: Dec. 3, 2013

(54) LIQUID CRYSTAL DISPLAY DEVICE AND METHOD OF MANUFACTURING THE SAME

(75) Inventors: Kum Mi Oh, Seoul (KR); Han Seok Lee, Seoul (KR); Hee Sun Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 210 days.

(21) Appl. No.: 13/208,935

(22) Filed: Aug. 12, 2011

(65) Prior Publication Data

US 2012/0154728 A1    Jun. 21, 2012

(30) Foreign Application Priority Data

Dec. 21, 2010    (KR) .................. 10-2010-0131618

(51) Int. Cl.
   *G02F 1/13*     (2006.01)
   *G02F 1/136*    (2006.01)
(52) U.S. Cl.
   USPC ............................................. 349/187; 349/43
(58) Field of Classification Search
   USPC ........................................................ 349/187
   See application file for complete search history.

(56) References Cited

U.S. PATENT DOCUMENTS

| | | | | |
|---|---|---|---|---|
| 2008/0299726 A1* | 12/2008 | Ninomiya et al. | ............ | 438/270 |
| 2011/0037917 A1* | 2/2011 | Kimura | ............................ | 349/46 |
| 2011/0063545 A1* | 3/2011 | Egi et al. | ......................... | 349/96 |
| 2011/0069254 A1* | 3/2011 | Takama et al. | .................. | 349/62 |

FOREIGN PATENT DOCUMENTS

| | | |
|---|---|---|
| JP | 2004-264652 A | 9/2004 |
| KR | 10-2006-0077880 A | 7/2006 |

* cited by examiner

*Primary Examiner* — Timothy L Rude
(74) *Attorney, Agent, or Firm* — McKenna Long & Aldridge LLP

(57) ABSTRACT

Disclosed is LCD device and a method of manufacturing the same, which increases a margin between the channel width and length (W/L) of a thin film transistor having a multi-gate structure, wherein the device comprises a substrate where a plurality of pixel regions are defined by a data line and a gate line; an active layer formed at each of a plurality of pixel regions of the substrate; a gate electrode comprising a plurality of multi-patterns overlapping with the active layer with an insulation layer therebetween; and a data electrode electrically connected to the active layer, wherein the multi-patterns are formed in straight by compensating pattern distortion of an edge portion of a gate pattern, and formed with the gate pattern which is designed to comprise a plurality of compensation patterns.

5 Claims, 11 Drawing Sheets

| Mask | Layer |
|---|---|
| 1 | Light shield |
| 2 | Active |
| 3 | Gate |
| 4 | ILD & contact |
| 5 | Data (Source/Drain) |
| 6 | PAS0, PAS1 |
| 7 | Vcom |
| 8 | conductive line |
| 9 | PAS2 |
| 10 | Pixel |

<GATE PATTERN UPON DESIGN>  <ACTUAL PR PATTERN>

< GATE PATTERN APPLYING COMPENSATION PATTERN >

<ACTUAL PR PATTERN>

| Mask | Layer |
|---|---|
| 1 | Active |
| 2 | Multi Gate |
| 3 | ILD & contact |
| 4 | Data (Source/Drain) |
| 5 | PAS1 |
| 6 | Vcom |
| 7 | conductive line |
| 8 | PAS2 |
| 9 | Pixel |

(a)

(b)

LIQUID CRYSTAL DISPLAY DEVICE AND METHOD OF MANUFACTURING THE SAME

CROSS REFERENCE TO RELATED APPLICATIONS

This application claims the benefit of the Korean Patent Application No. 10-2010-0131618 filed on Dec. 21, 2010, which is hereby incorporated by reference in its entirety as if fully set forth herein.

BACKGROUND

1. Field of the Disclosure

The present disclosure relates to a Liquid Crystal Display (LCD) device, and more particularly, an LCD device and a method of manufacturing the same, which increases a margin between the channel width and length (W/L) of a thin film transistor having a multi-gate structure.

2. Discussion of the Related Art

With the advance of portable electronic devices such as mobile communication terminals and notebook computers, demands for Flat Panel Display (FPD) devices are increasing.

FPD devices, LCD devices, Plasma Display Panels (PDPs), Field Emission Display (FED) devices and Light Emitting Diode (LED) display devices continue to be researched and developed. Among the FPD devices, applications of LCD devices are being expanded because the LCD devices are easily manufactured, are easily driven, have high image quality and large screen sizes.

Touch screens that replace input devices such as mice or keyboards and allow a user to directly input information by finger, pen, or stylus are being applied to flat panel devices.

Touch screens are being applied in various fields, for example, mobile terminals for navigation, industrial terminals, notebook computers, financial automation equipment, game machines, portable terminals such as portable phones, MPEG Audio layer 3 (MP3) players, Personal Digital Assistants (PDAs), Portable Multimedia Players (PMPs), Play Station Portables (PSP), portable game machines and Digital Multimedia Broadcasting (DMB) receivers, and appliances such as refrigerators, microwave ovens and laundry machines. The application of the touch screens are being expanded because all users can easily manipulate the touch screens.

LCD devices with built-in touch screens are recently being developed to reduce the size of electronic equipment. Particularly, an in-cell type of LCD device that uses an existing element in the active structure such as a common electrode formed in a lower substrate as a touch sensing electrode is being developed.

FIG. 1 is a view illustrating the related art LCD device with built-in touch screen and driving method thereof. Referring to FIG. 1, the related art LCD device with built-in touch screen 10 includes a lower substrate 50 and an upper substrate 60 that are coupled with a liquid crystal layer (not shown) in between.

As an example of built-in touch screen operation, the pixel array 40 can also be used as a touch screen TS sensor. A small voltage may be applied to the pixel array 40 to create a uniform electrostatic field. When a conductor, such as a human finger or other object, touches the uncoated front surface, a capacitor Ctc is formed. A controller connected to the touch screen TS sensor can determine the location of the touch indirectly from the change in the capacitance as measured from the four corners of the touch screen TS sensor.

The upper substrate 60 includes a black matrix 62 that defines a pixel region so as to be in correspondence with each of a plurality of pixels, a red color filter 64R that is formed in a pixel defined by the black matrix 62, a green color filter 64G that is formed in a pixel defined by the black matrix 62, a blue color filter 64B that is formed in a pixel defined by the black matrix 62, and an overcoat layer 66 that is formed to cover the black matrix 62 and the color filters 64R, 64G and 64B to planarizes the upper substrate 60.

The lower substrate 50 includes a pixel array 40 that includes a plurality of pixels to drive the liquid crystal layer and for detecting the touch of a user's finger or a pen. Each of the pixels is defined by a data line and a gate line that intersect each other. A Thin Film Transistor (TFT) is formed in a region where the data line and the gate line intersect. Also, each of the pixels includes a common electrode and a pixel electrode.

FIG. 2 is a cross sectional view illustrating a lower substrate structure 50 of the related art LCD device with built-in touch screen. In FIG. 2, a lower substrate structure having a Fringe Field Switch (FFS) mode is illustrated. The FFS mode operation is described below.

Referring to FIG. 2, each pixel of the lower substrate 50 includes: a light shield layer 71 formed on a glass substrate; a buffer layer 51 formed on the light shield layer 71; an active layer 72 (i.e., a semiconductor layer) formed on the buffer layer 51; a gate insulation layer 52 formed on the active layer 72; a gate electrode 73 formed of a metal material on the gate insulation layer 52 to overlap with a portion of the active layer 72; an Inter Layer Dielectric (ILD) 53 formed on the gate electrode 73 to insulate the gate electrode 73 and the data electrode 74 (source/drain); and a data electrode 74 electrically connected to the active layer 72.

The gate insulation layer 52 and the ILD 53 are etched, and thus a first contact hole is formed to expose a partial region of the active layer 72. The data electrode 74 is formed by burying a metal material in the contact hole. Furthermore, the data electrode 74 is electrically connected to the pixel electrode 77 (pixel ITO).

Each pixel of the lower substrate 50 includes a first passivation layer 54 (PAS0) and a second passivation layer 55 (PAS1) that are sequentially formed to cover the gate electrode 73 and the data electrode 74. Each pixel of the lower substrate 50 also includes a common electrode 75 formed on the second passivation layer 55, and a conductive line 76 (3rd metal) that is formed on one side of the common electrode 75 and electrically connected to common electrodes of adjacent pixels. Also included are a third passivation layer 56 (PAS2) that is formed to cover the common electrode 75 and the conductive line 76, and a pixel electrode 77 that is formed to be electrically connected to the data electrode 74.

A thin film transistor being a switching device of an LCD device may be formed in a top gate structure or a bottom gate structure. When the thin film transistor is formed in the top gate structure, a backlight irradiates light on the active layer 72 through the substrate, as shown. Therefore, a light leakage current occurs in the active layer 72 image degradation such as crosstalk may arise. Crosstalk is an undesirable visual phenomenon resulting from unintended pixels turning on to image misinformation. The combination of residual gate voltage during the decay time after the gate is turned off plus photonic energy absorbed from the backlight unit may be enough to at least partially turn the TFT on when it is intended to be off.

To prevent such limitations, a metal layer, i.e., the light shield layer 71 for shielding light is disposed under the active layer 72. Therefore, light of the backlight is prevented from being irradiated on the active layer 72, and thus a leakage current is minimized.

The electron mobility property of amorphous silicon limits the operational speed and the geometric design rules of the TFT. To overcome such limitations, low temperature polysilicon (LTPS) is being used as a material for forming the active elements (for example, TFT) of the lower substrate 50 because the electron mobility is about 100 times higher than a-Si. Even when LTPS is used as a material for forming the TFT of the lower substrate 50, as illustrated in FIG. 3, ten (10) masks corresponding to patterned layers are used in a manufacture process, and therefore, a plurality of detailed processes 155 (steps) are performed.

LTPS enables higher resolution display panels as compared to a-Si, and has excellent characteristic for TFT operations. However, LTPS requires the manufacture process to have more masks and detailed processes than a-Si because there are extra annealing steps. Therefore, the price competitiveness is limited and manufacturing efficiency is reduced.

As described above, with regard to the top gate structure, when forming the light shield layer 71 for preventing the light leakage current of the active layer 72, a separate mask for forming the light shield layer 71 is used. Therefore, the manufacturing cost increases because extra steps to process the separate mask are performed, causing a reduction in productivity.

FIG. 4 is a view illustrating a multi-gate structure of a related art LCD device.

Referring to FIG. 4, to improve limitations where a manufacture method increases due to the use of LTPS, proposed has been a method that removes the light shield layer 71 and form a TFT in a multi-gate structure for reducing a light leakage current. The shape of a pixel is very narrow in a high resolution LCD device. Therefore, when forming a gate pattern 80, an interval margin, the difference between geometric features of the TFT, between lines is insufficient.

Accordingly, when forming a photoresist (PR) pattern 90 for forming the gate pattern 80, the PR pattern 90 is distorted due to process limitations. Due to the PR distortion, a corner portion of the PR pattern 90 is rounded rather than sharp. When a gate pattern is formed with the PR pattern 90 having a rounded corner portion, distortion occurs in the gate pattern. This distortion causes the margin between the channel width and length (W/L) of a TFT to be reduced. Due to the reduction in the margin, the driving performance of an LCD device is degraded because there are differences between the TFT design and what is actually produced.

SUMMARY

Accordingly, the present disclosure is directed to an LCD device and a method of manufacturing the same, which can increase a margin between the channel width and length (W/L) of a thin film transistor having a multi-gate structure.

An aspect of the present disclosure is to provide an LCD device and a method of manufacturing the same, which can increase an exposure process margin in accordance with the manufacture of a thin film transistor having a multi-gate structure.

Another aspect of the present disclosure is to provide an LCD device and a method of manufacturing the same, which decreases a mask process when forming a lower substrate, thereby saving the cost.

Another aspect of the present disclosure is to provide a thin film transistor structure and a method of manufacturing the same, which can reduce a light leakage current of an active layer in a top gate TFT structure.

Another aspect of the present disclosure is to provide an LCD device and a method of manufacturing the same, which simplifies a process of manufacturing a lower substrate, thereby enhancing manufacturing efficiency.

Another aspect of the present disclosure is to provide an LCD device and a method of manufacturing the same, which uses Low Temperature Poly Silicon (LTPS) as a material of a lower substrate to enhance driving performance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an LCD device comprising: a first substrate with a plurality of pixel regions defined by data lines and gate lines; an active layer in each pixel region of the substrate; a gate electrode layer comprising a plurality of gate electrodes as multi-patterns overlapping with the active layer with an insulation layer therebetween; and a data electrode electrically connected to the active layer, wherein the multi-patterns have straight edges by compensating pattern distortion of an edge portion of a gate pattern and square corners formed with the gate pattern which is designed to comprise a plurality of compensation patterns.

The compensation patterns may comprise a positive compensation pattern and a negative compensation pattern.

The multi-patterns may comprise: a first multi-pattern protruding from the gate line to perpendicularly intersect the gate line; and a second multi-pattern protruding from the first multi-pattern to perpendicularly intersect the first multi-pattern.

Pattern compensation for an end edge portion of the first multi-pattern and an end edge portion of the second multi-pattern may be performed by the positive compensation pattern.

Pattern compensation for a portion where the first multi-pattern and the second multi-pattern branch from each other may be performed by the negative compensation pattern.

A plurality of channels may be formed by overlapping of the active layer and multi-patterns.

In another aspect of the present disclosure, there is provided a method of manufacturing an LCD device comprising: coating a semiconductor material on a substrate where a plurality of pixel regions are defined by data lines and gate lines; patterning the semiconductor material into an active layer at each of a plurality of pixel regions; forming an insulation layer on the active layer; coating a conductive material on the insulation layer; patterning a gate electrode with a plurality of multi-patterns overlapping with a partial region of the active layer; etching a partial region of the insulation layer to create a contact hole to expose a partial region of the active layer; burying a conductive material in the contact hole to form a data electrode which is electrically connected to the active layer; and doping a Lightly Doped Drain (LDD) around a plurality of channels formed by the active layer and the multi-patterns which overlap with each other with the insulation layer therebetween, wherein the multi-patterns are formed with straight edges by compensating pattern distortion of an edge portion of a gate pattern, and formed with the gate pattern which is designed to comprise a plurality of compensation patterns.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
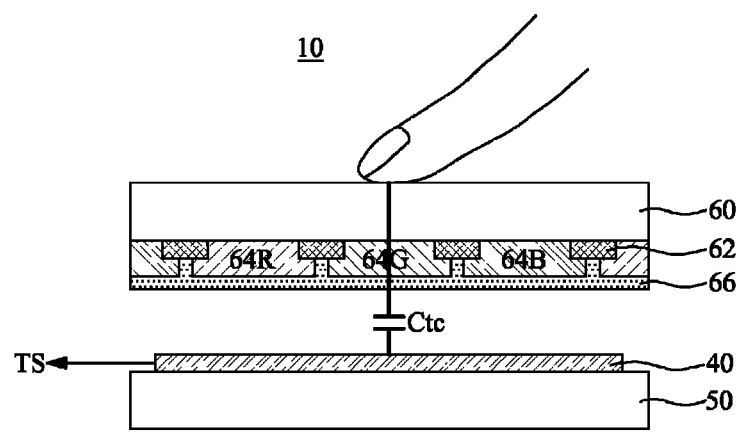
FIG. 1 is a view illustrating the related art LCD device with built-in touch screen and driving method thereof.
Figure 2:
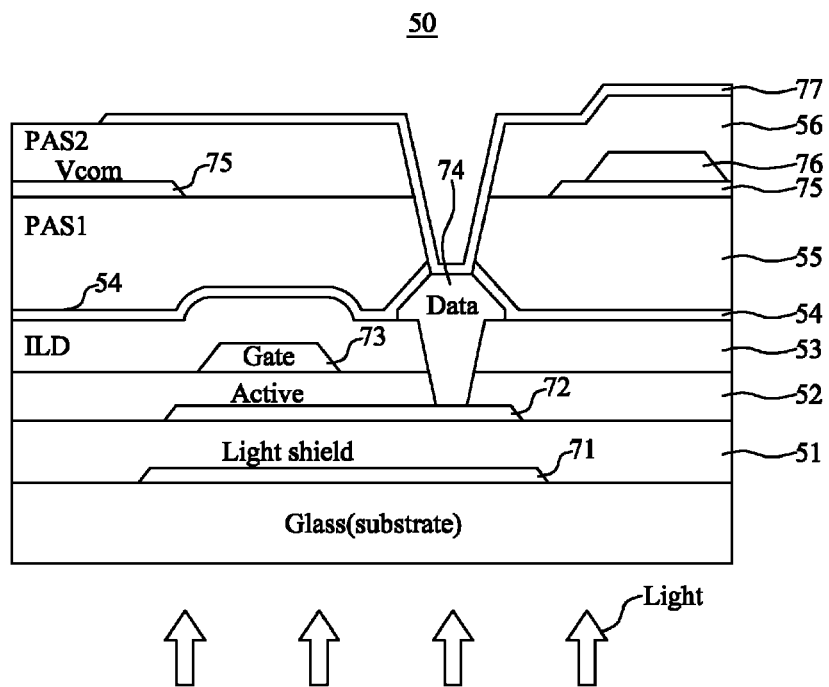
FIG. 2 is a cross sectional view illustrating a lower substrate structure of the related art LCD device with built-in touch screen.
Figures 3, 4:
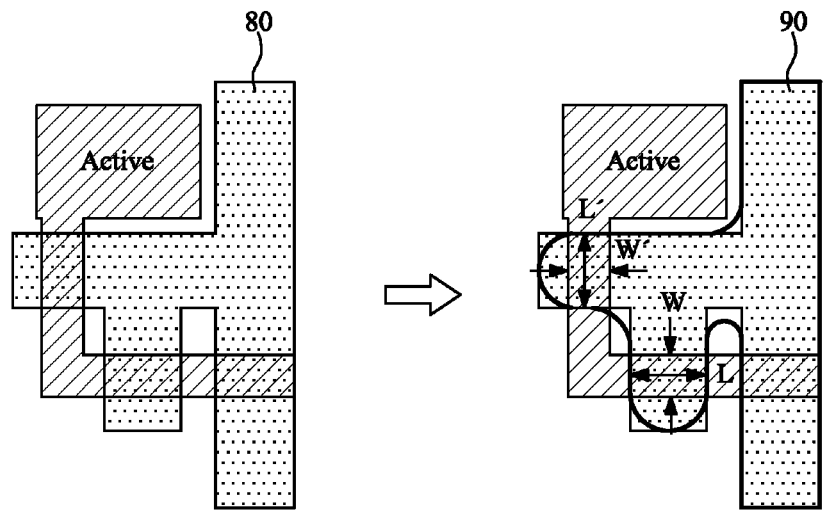
FIG. 3 is a list of mask layers for manufacturing an LCD device with built-in touch screen according to the related art.
FIG. 4 is a view illustrating a multi-gate structure and manufacture method of the related art LCD device.

Reference will now be made in detail to the exemplary embodiments of the present disclosure, examples of which are illustrated in the accompanying drawings. Wherever possible, the same reference numbers will be used throughout the drawings to refer to the same or like parts.

In the description of exemplary embodiments of the present disclosure, when a structure (for example, an electrode, a line, a line layer, or a contact) is described as being formed over, on, under, or below another structure, it should be understood that the description includes a case in which the structures contact each other and one in which a third structure is disposed between the structures.

Furthermore, the terms "over, on, under, and below" are used for describing a structure and manufacture method of the present disclosure with reference to the accompanying drawings. Therefore, the terms may refer to different configurative concepts during a manufacturing process and upon completion thereof.

LCD devices have been variously developed to be driven in a Twisted Nematic (TN) mode, a Vertical Alignment (VA) mode, an In Plane Switching (IPS) mode, or a Fringe Field Switching (FFS) mode according to a scheme of controlling a liquid crystal layer.

Among the modes, the IPS mode and the FFS mode are modes where a pixel electrode and a common electrode are both disposed on a lower substrate, and the alignment of a liquid crystal layer is controlled by an electric field between the pixel electrode and the common electrode. Particularly, the IPS mode is a mode where the pixel electrode and the common electrode are alternately arranged in parallel and generate a horizontal electric field in between to control the alignment of the liquid crystal layer. In the IPS mode, however, since the alignment of the liquid crystal layer may not be controlled at an upper portion of the pixel electrode and an upper portion of the common electrode, light transmissivity is reduced at a corresponding region.

To solve the limitations of the IPS mode, the FFS mode has been proposed. In the FFS mode, the pixel electrode and the common electrode may be formed to be separated from each other with an insulation layer in between. Specifically, the FFS mode is a mode where one electrode may be formed in a plate shape or a pattern, another electrode is formed in a finger shape, and the alignment of the liquid crystal layer is controlled by a fringe field that is generated between the electrodes.

An LCD device with built-in touch screen according to embodiments of the present disclosure may have a structure of the FFS mode, and include: an in-cell touch type of liquid crystal panel that has a built-in touch screen for detecting a user's touch point; a backlight unit that irradiates light on the liquid crystal panel; and a driving circuit.

The driving circuit may include a timing controller (T-con), a data driver (D-IC), a gate driver (G-IC), a touch sensing driver, a backlight driver, and a power source. An entirety or a portion of the driving circuit may be formed in a Chip On Glass (COG) or a Chip On Film (COF, chip on flexible printed circuit) type.

The liquid crystal panel may include an upper substrate and a lower substrate that are coupled with a liquid crystal layer in between, and a plurality of pixels may be arranged in a matrix.

The liquid crystal panel may control transmissivity of light that is transmitted through the liquid crystal layers of a plurality of pixels according to a data voltage, thereby displaying an image based on the video signal. Also, a common electrode formed at the lower substrate may be driven as a touch sensing electrode. Therefore, the liquid crystal panel may sense the change of a capacitance due to a user's touch to detect a user's touch.

The upper substrate may include a black matrix that defines a pixel region so as to correspond with each of a plurality of pixels, a red color filter that is formed in a pixel defined by the black matrix, a green color filter that is formed in a pixel defined by the black matrix, a blue color filter that is formed in a pixel defined by the black matrix, and an overcoat layer that is formed to cover the black matrix and the color filters and planarizes the upper substrate. The lower substrate may include a pixel array that drives the liquid crystal layer and includes a plurality of pixels for detecting a touch point with a capacitance based on a user's touch. The pixel array may include a TFT, a common electrode, and a conductive line contacting a common electrode formed in each pixel, which will be described below.

A gate line and a data line may be formed on the lower substrate to intersect perpendicularly. A plurality of pixels may be defined by the gate line and the data line. In each of the pixels, a TFT may be formed as a switching device, and a pixel electrode electrically connected to the TFT may also be formed in the each pixel.

Herein, the TFT may include a gate electrode, an active layer (i.e., a semiconductor layer), an insulation layer, and a data electrode (i.e., a source/drain electrode). The TFT may have a bottom gate structure where a gate electrode is disposed under an active layer, or have a top gate structure where a gate electrode is disposed on an active layer. An LCD device with built-in touch screen according to embodiments of the present disclosure may use LTPS as a material of the lower substrate.

Embodiments of the present disclosure will be described with reference to the accompanying drawings.

Figure 5:
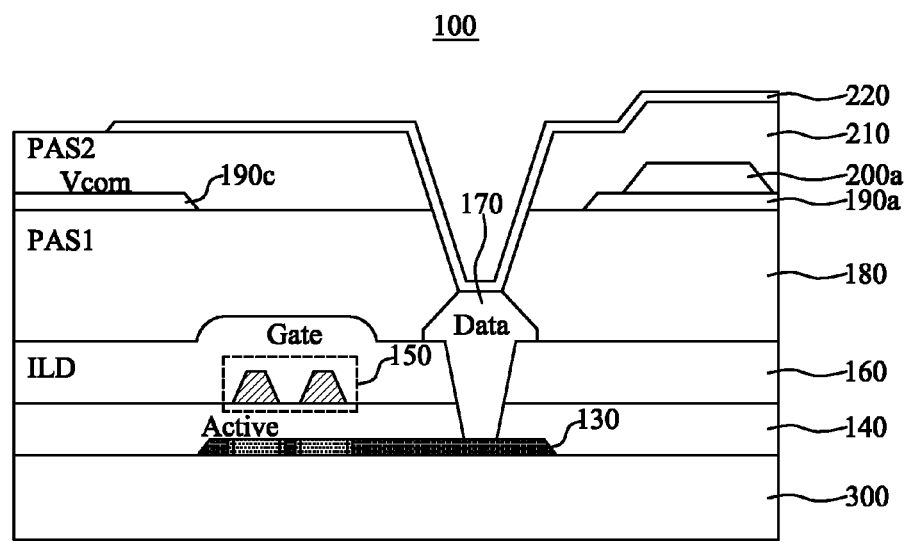
FIG. 5 is a cross-sectional view illustrating a lower substrate structure of an LCD device according to an exemplary embodiment of the present disclosure.
Figure 6:
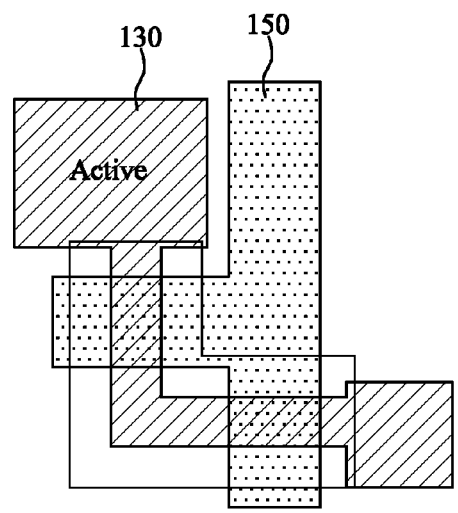
FIG. 6 is a view illustrating a multi-gate structure of a TFT in an LCD device according to an exemplary embodiment of the present disclosure.

FIG. 5 is a cross-sectional view illustrating a lower substrate structure of an LCD device according to an exemplary embodiment of the present disclosure. FIG. 6 is a view illustrating a multi-gate structure of a TFT in an LCD device according to an exemplary embodiment of the present disclosure. In FIG. 5, one pixel formed at a lower substrate is illustrated.

Referring to FIGS. 5 and 6, a plurality of pixels may be formed at a lower substrate 100. Each of the pixels may include an active layer (i.e., a semiconductor layer) 130 on a transparent substrate 300 which can be any form of glass or plastic, a gate electrode 150 where a plurality of multi-patterns that overlap the active layer 130 to form a channel are formed, a data electrode 170, and a TFT formed as an insulation layer. A channel is a portion of the active layer 130 in which charge carriers flow.

Each pixel may include: a pixel electrode 220 that is connected to the TFT and supplies a pixel voltage based on a video signal to a pixel; a common electrode layer 190a, 190c supplying a common voltage (Vcom) to the pixel; and a conductive line 200a contacting the common electrode layer 190a, of an adjacent pixel in a horizontal direction and/or a vertical direction.

Herein, the conductive line 200a may be formed as a contact line that allows the common electrode 190a formed in each pixel to be driven as a touch sensing electrode for detecting touch. In this case, the conductive line 200a may be formed in the same direction as that of a gate line by using a metal or other suitable material for forming a gate line. Alternatively, the conductive line 200a may be formed in the same direction as that of a data line by using a metal or other suitable material for forming a data line.

Specifically, each pixel may also include: a buffer layer (not shown) formed on a substrate; a gate insulation layer 140 formed on the active layer 130; the gate electrode 150 that is formed on the gate insulation layer 140 to overlap with the active layer 130; an Inter Layer Dielectric (ILD) 160 that is formed on the gate electrode 150 to insulate the gate electrode 150 and the data electrode 170; and the data electrode 170 (source/drain) that is formed to be electrically connected to the active layer 130 of which a partial portion is exposed by a contact hole.

As illustrated in FIG. 6, the gate electrode 150 (i.e., a multi-gate) may include a plurality of multi-patterns that protrude from a gate line into a pixel. The multi-patterns may overlap with the active layer 130 with the gate insulation layer 140 in between, and thus a plurality of channels may be formed.

A portion of the gate insulation layer 140 and a portion of the inter layer dielectric 160 may be etched in order for a partial region of the active layer 130 to be exposed, and thus a contact hole may be formed. A conductive material may be buried in the contact hole, and the data electrode 170 is formed. The data electrode 170 may be electrically connected to the pixel electrode 220.

The gate electrode 150 may include a plurality of multi-patterns and may be formed in a multi-gate structure. The first multi-pattern of the multi-patterns may be formed to perpendicularly intersect the gate line. The second multi-pattern of the multi-patterns may branch from the first multi-pattern and may be formed in the same direction as that of the gate line.

The multi-patterns may overlap with the active layer 130 with the gate insulation layer 140 in between, thereby allowing a plurality of channels to be formed. Although not shown, the multi-patterns forming the gate electrode 150 may be formed at a region corresponding to a black matrix BM that is formed at an upper substrate. Accordingly, even if the gate electrode 150 is formed to have the multi-patterns, the gate electrode 150 does not reduce a pixel aperture ratio.

To minimize leakage current and increase driving reliability, a plurality of Lightly Doped Drain (LDD) regions may be formed at the active layer 130. As an example, first and second channels may be formed at regions where the active layer 130 overlap with the first and second multi-patterns, respectively. The LDD regions (for example, n-doping regions) may be formed at left and right sides of each of the first and second channels, respectively. The LDD regions minimize leakage current by reducing the electric field intensity near the drain region.

The LCD device according to an embodiment of the present disclosure may not include a separate layer (i.e., the related art light shield layer) for shielding light that is irradiated from a backlight onto the active layer 130. However, a plurality of channels 132 may be formed, and the plurality of LDD regions for preventing a leakage current may also be formed at the active layer 130. Accordingly, the LCD device according to an embodiment of the present disclosure can prevent the leakage current of the active layer 130 even without a light shield means such as the metal layer for shielding light.

A first passivation layer 180 (PAS1) may be formed on the inter layer dielectric 160 to cover the gate electrode 150 and the data electrode 170. A common electrode layer 190a, 190c may be formed of a transparent conductive material such as indium tin oxide (ITO) or indium zinc oxide (IZO), at a portion of a top of the first passivation layer 180. A conductive line 200a may be formed on the common electrode layer 190a, 190c. The common electrode 190a, 190c and the conductive line 200a are electrically connected.

A second passivation layer 210 (PAS2) may be formed to cover the common electrode layer 190a, 190c and the conductive line 200a. The pixel electrode 220 may be formed of a transparent conductive material such as ITO. The pixel electrode 220 may be formed on the second passivation layer 210 to be electrically connected to the data electrode 170. In this case, a contact hole may be formed by etching a portion of the first passivation layer 180 and a portion of the second passivation layer 210, and thus, a top of the data electrode 170 is exposed. The pixel electrode 220 may be formed in the contact hole that is formed in order for the data electrode 170 to be exposed, and is electrically connected to the data electrode 170.

Electronics of the LCD device according to an embodiment of the present disclosure may apply a data voltage and a common voltage to the pixel array of the lower substrate 100 for one display frame. Therefore, the LCD device controls transmissivity of light that is transmitted through the liquid crystal layer of each pixel, to display an image based on an input video signal. During a non-display driving period, the LCD device according to an embodiment of the present disclosure may drive the common electrode 190a of each pixel, which is connected by the conductive line 200a, as a touch sensing electrode to sense the change in a capacitance (Ctc) based on a user's touch.

For this, the Vcom electrode 190c may supply a common voltage Vcom to each pixel for one display frame. Furthermore, the common electrode 190a may be driven as the touch sensing electrode for detecting touch during the non-display period.

The LCD device according to an embodiment of the present disclosure may include a TFT of a top multi-gate structure, but may not include a separate light shield layer for shielding light incident on the active layer 130.

The LCD device according to an embodiment of the present disclosure including the above-described elements may form the TFT with the active layer 130 and the gate electrode 150 formed as the multi-gate, and thus may form a plurality of channels and LDD regions. Therefore, the LCD device according to an embodiment can prevent the leakage current of the active layer 130 due to incident light even without a separate 1 layer for shielding light in an active region.

Figure 7:
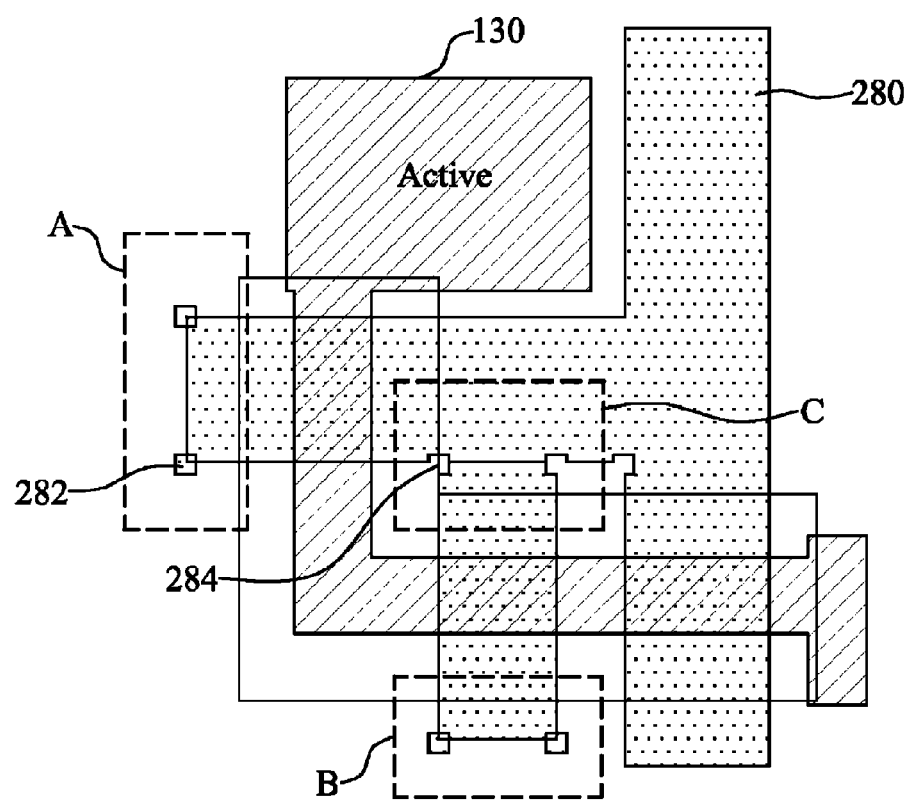
FIGS. 7 to 10 are views illustrating a method of manufacturing a gate electrode having a multi-gate structure, according to an exemplary embodiment of the present disclosure.

Hereinafter, a method of manufacturing a gate electrode having the multi-gate structure will be described with reference to FIGS. 7 to 10. As illustrated in FIG. 7, pattern distortion occurs in an edge portion of a gate pattern caused by an exposure process for forming the multi-gate. Taking this into account, an alternate gate pattern 280 may be designed.

A positive compensation pattern 282 may be formed at an end edge portion 'A' of a first multi-pattern of the gate pattern 280 that is designed for forming the gate electrode 150. Moreover, a positive compensation pattern 282 may be formed even at an end edge portion 'B' of a second multi-pattern that protrudes vertically from the first multi-pattern. Furthermore, a negative compensation pattern 284 may be formed at an edge portion 'C' from which the first and second multi-patterns branch.

Figure 8:
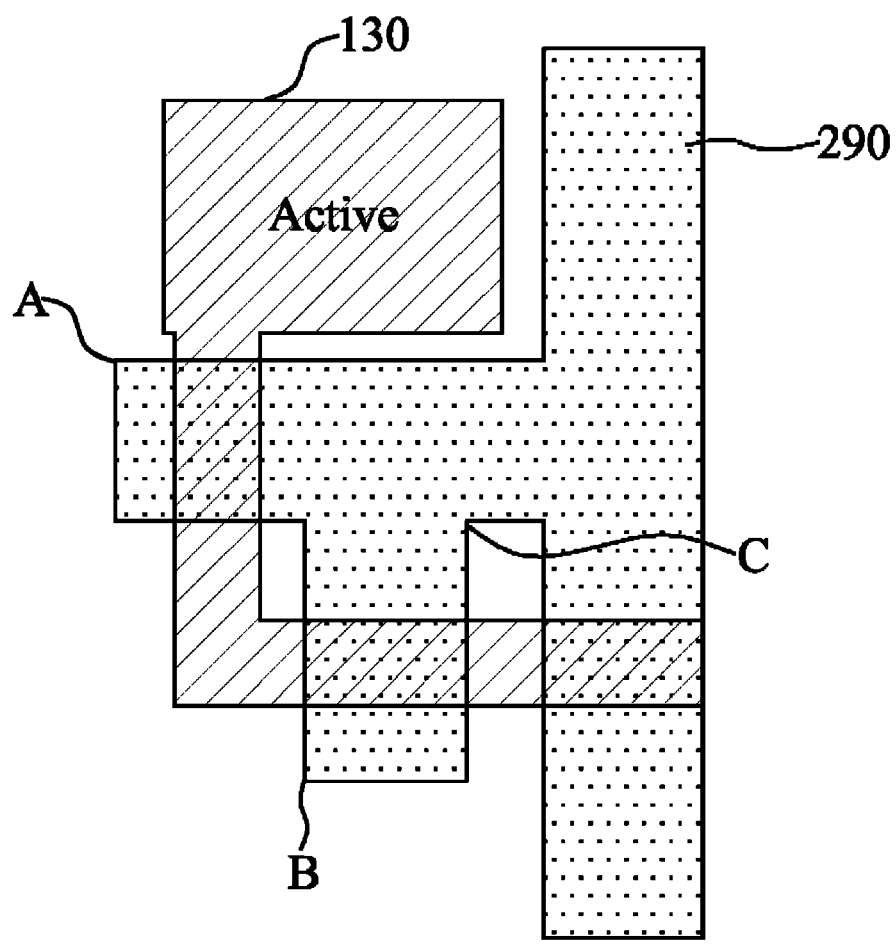

Subsequently, as illustrated in FIG. 8, a PR pattern 290 may be formed with the gate pattern 280 that is designed to include the positive compensation pattern 282 and negative compensation pattern 284 of FIG. 7. In this case, the distortion of the PR pattern 290 may be compensated by the positive compensation pattern 282 and the negative compensation pattern 284, and thus the edge portions A to C are formed straight.

Figure 9:
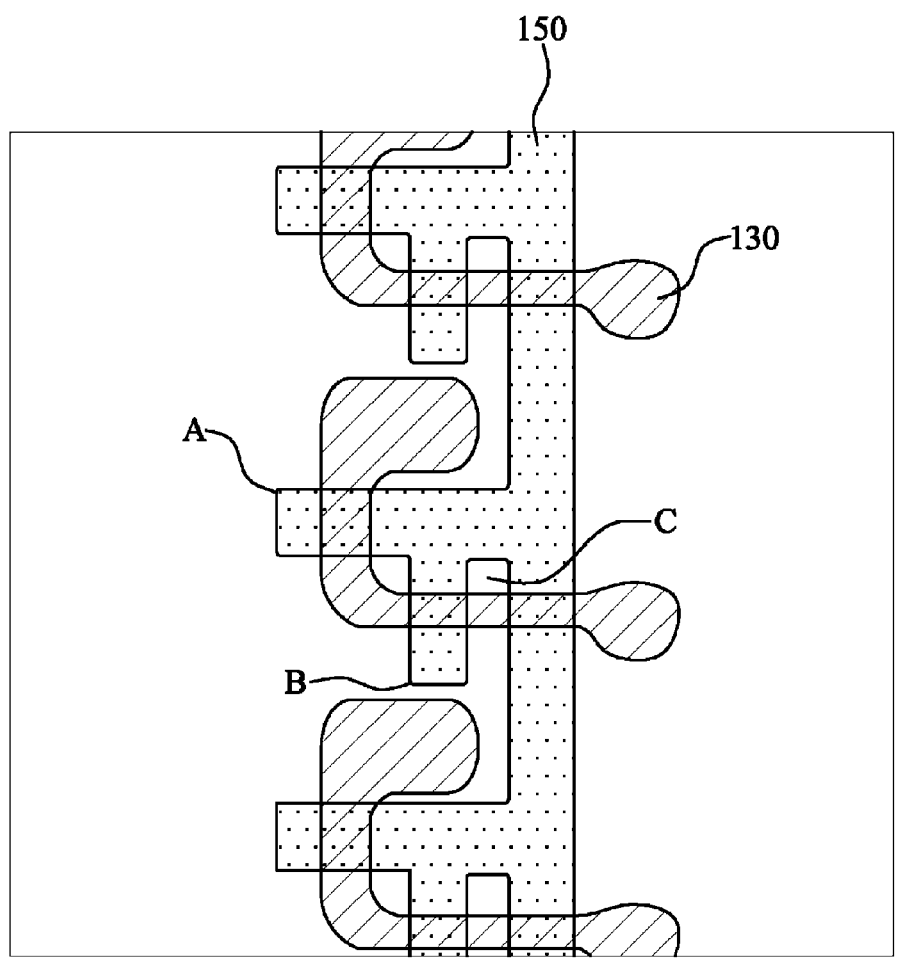

Thereafter, as illustrated in FIG. 9, if the gate electrode 150 is formed with the PR pattern 290, the gate electrode 150 including a plurality of multi-patterns where the edge portions A to C may be formed straight. Therefore, a margin between the channel width and length (W/L) of the TFT including the gate electrode 150 of the multi-gate structure may be increased, and thus the driving performance of the LCD device can be enhanced.

FIGS. 6 to 9 illustrate a multi-gate structure where two multi-patterns are formed, but they merely illustrate one embodiment of the present disclosure. In another embodiment of the present disclosure, a plurality of channels may be formed by forming three or more multi-patterns in the gate electrode 150.

The LCD device structure according to the above-described embodiment of the present disclosure can allow the light shield layer that shields light incident on the active layer 130 to be removed by using the gate electrode 150 of the multi-gate structure. That is, the LCD device structure can prevent leakage current of the active layer 130 due to incident light even without the related art light shield layer.

Accordingly, as illustrated in FIGS. 3 to 10, the present disclosure decreases one mask necessary for forming the light shield layer compared to the related art and therefore, can allow a process reduction by about 12.2% relative to the related art (for example, reduce 155 steps to 136 steps).

Figures 10, 11:
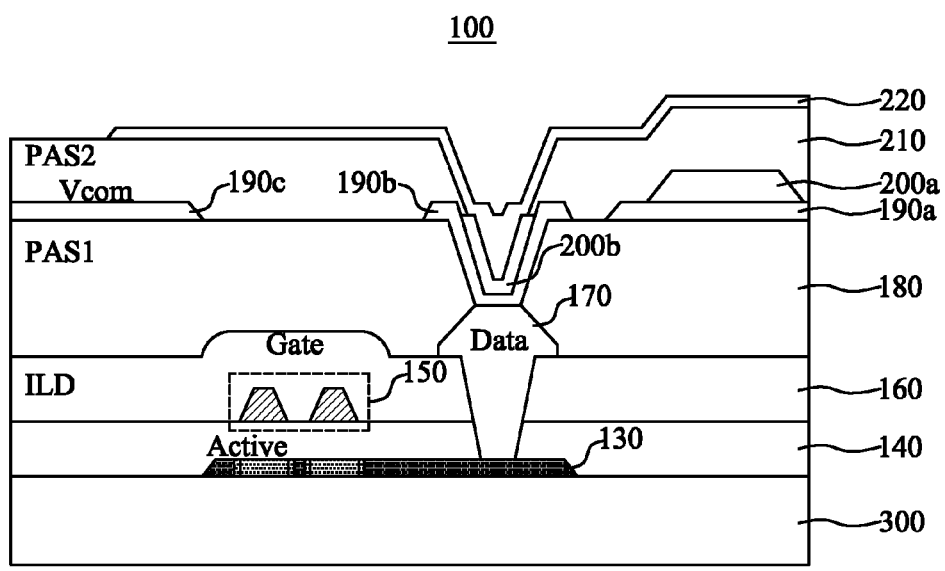
FIG. 11 is a cross-sectional view illustrating a lower substrate structure of an LCD device according to another exemplary embodiment of the present disclosure.

In the description that has been made above with reference to FIG. 5, the data electrode 170 may be directly connected to the pixel electrode 220, which merely illustrates one embodiment of the present disclosure. In another embodiment of the present disclosure, as illustrated in FIG. 11, an LCD device may have a structure where the common electrode layer 190a, 190b, 190c and the conductive layer 200a, 200b are formed between the data electrode 170 and the pixel electrode 220. The data electrode 170 and the pixel electrode 220 may be connected using the structure. In this case, the common via 190b and the conductive via 200b, which are formed at a contact hole region exposing the top of the data electrode 170, may be used as a contact layer for the contact of the data electrode 170 and pixel electrode 220.

Therefore, a common via 190b formed at the contact hole region and a conductive via 200b formed on the first passivation layer 180 may be electrically shorted, and a separate common voltage is not supplied to the common via 190b formed at the contact hole region. On the other hand, a common voltage Vcom may be supplied to the Vcom electrode 190c formed on the first passivation layer 180.

Hereinafter, a method of manufacturing an LCD device according to an embodiment of the present disclosure will be described with reference to FIGS. 12 to 15.

A method of manufacturing an LCD device according to an embodiment of the present disclosure, as illustrated in FIGS. 5 to 11, removes a process of forming a separate layer (i.e., a light shield layer) that shields light incident on a bottom of an active layer and forms a TFT with a gate electrode formed as a multi-gate. Therefore, the present disclosure reduces one mask used for a manufacturing method of the light shield layer compared to the related art, thereby decreasing the process. Also, the present disclosure increases an LDD region without the reduction in pixel aperture ratio, thus preventing the light leakage current of the active layer.

Figure 12:
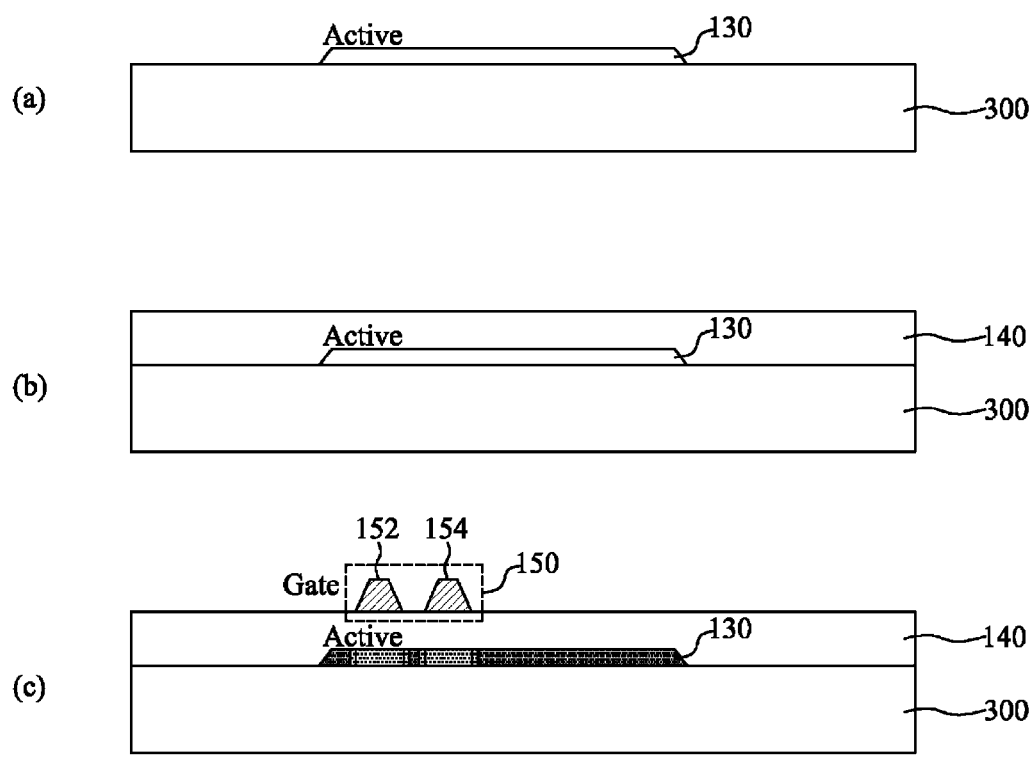
FIGS. 12 to 15 are views illustrating a method of manufacturing a gate electrode having a multi-gate structure, according to an exemplary embodiment of the present disclosure.

To provide a detailed example, as illustrated in a portion (a) of FIG. 12, a semiconductor material may be formed on a substrate 300. After which photolithography and an etching process process using a mask are performed. Thus, by patterning the semiconductor layer, an active layer 130 may be formed.

The substrate 300 may be a transparent glass or plastic material. Subsequently, as illustrated in a portion (b) of FIG. 12, a gate insulation layer 140 may be formed by depositing, for example, tetra ethyl ortho silicate (TEOS) or middle temperature oxide (MTO) over the substrate in Chemical Vapor Deposition (CVD).

Thereafter, as illustrated in a portion (c) of FIG. 12, a conductive material may be deposited on the gate insulation layer 140 to overlap with the active layer 130. Then, a gate electrode 150 may be formed by performing photolithography and an etching process using a mask.

Herein, the gate electrode 150 may be formed to have a plurality of multi-gates. As described above with reference to FIGS. 6 to 8, pattern distortion may occur in the edge portions A to C of the multi-gate patterns due to the exposure process for forming the multi-gate. In consideration of this, the gate pattern 280 may be designed to include the positive compensation pattern 282 and the negative compensation pattern 284. Subsequently, the PR pattern 290 may be formed with the gate pattern 280 that is designed to include the positive compensation pattern 282 and the negative compensation pattern 284. Thereafter, the gate electrode 150 may be formed with the PR pattern 290, and thus may includes a plurality of multi-patterns where an edge portion is straight. Therefore, by forming the TFT including the gate electrode 150 of the multi-gate structure, a margin between the channel width and length (W/L) of the TFT is increased.

Figure 13:
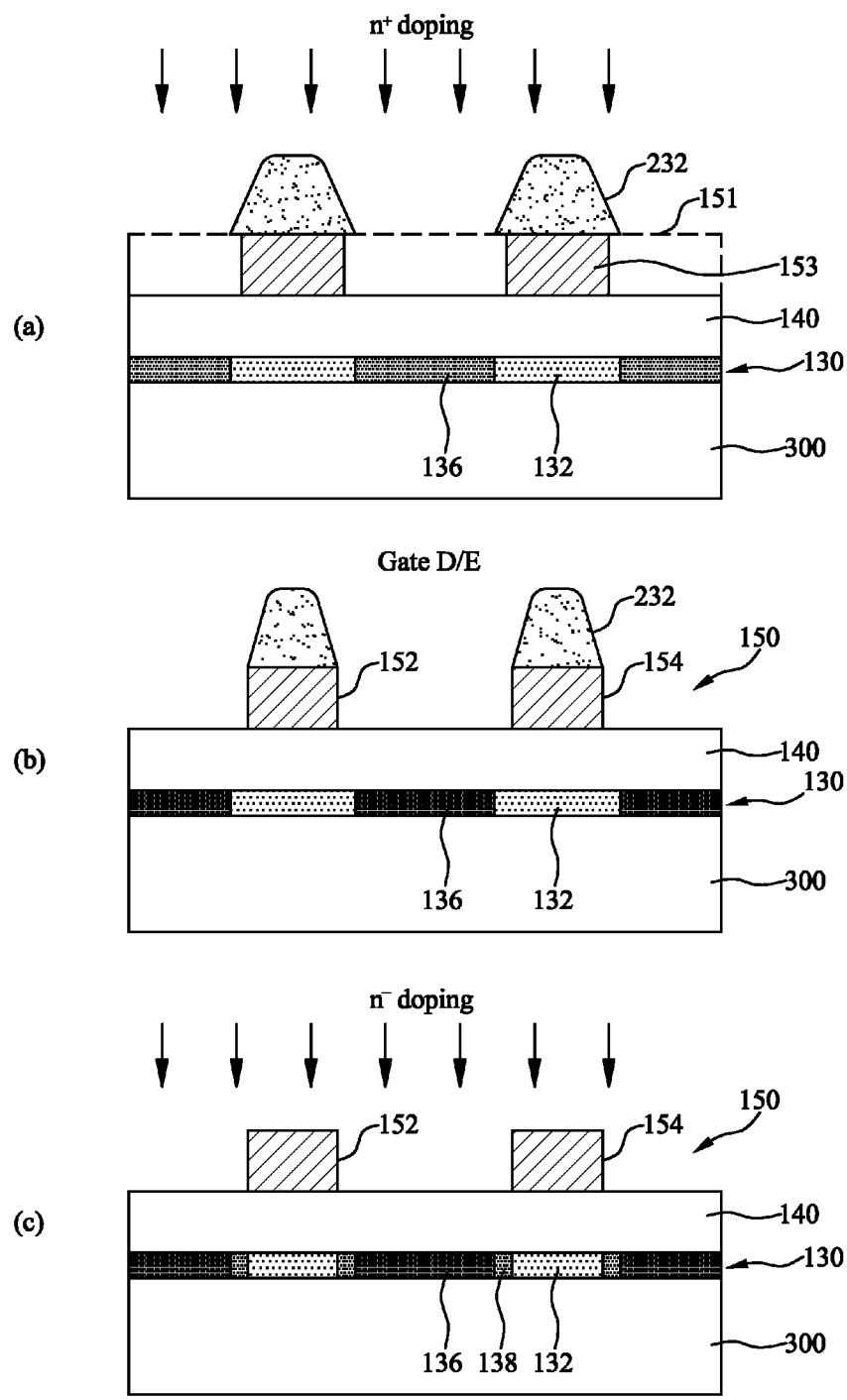

As illustrated in FIG. 13, an LDD region being a low concentration doping region may be formed at a portion of the left and right sides of a channel region 132 formed at the active layer 130 by using a metal pattern and a PR pattern 290 forming the multi-patterns of the gate electrode 150 as a mask. A region other than the channel region and the LDD region may be formed as a high concentration doping region 136. Although not shown, the gate pattern of the gate electrode 150 may be formed at a region corresponding to a black matrix BM formed at an upper substrate and does not affect the pixel aperture ratio.

Specifically, as illustrated in a portion (a) of FIG. 13, a conductive layer 151 is formed by depositing a metal material, for example, on a gate insulation layer 140 to overlap with the active layer 130. Subsequently, a plurality of patterns 153 may be formed by performing photolithography and an etching process using a PR pattern 232 as a mask. Then, the high concentration doping region 136 may be formed by n+ doping the active layer 130 by using a PR pattern 232 left on the patterns 153 as a mask.

Subsequently, as illustrated in a portion (b) of FIG. 13, the PR pattern 232 left on the metal patterns 153 may be removed, and a plurality of multi-patterns 152 and 154 may be formed by etching a portion of the patterns 153. Thereafter, as illustrated in a portion (b) of FIG. 13, the active layer 130 may be n– doped using the multi-patterns 152 and 154 of the gate electrode 150 as a mask.

At this point, in a portion (A) of FIG. 13, a portion of a region that is not n+ doped by the PR pattern 232 may be n– doped. Therefore, respective channels 132 are formed at a region overlapping with the gate patterns 152 and 154, and an LDD region 138 being a low concentration doping region is formed at a portion of left and right sides of the each channel.

Through the above-described manufacturing process, the LDD region 138 may be formed at the gate electrode 150 of the multi-gate structure and the active layer 130. Subsequently, as illustrated in a portion (a) of FIG. 14, an insulating material may be deposited on the substrate 300 to cover the gate electrode 150 and the gate insulation layer 140. Therefore, an inter layer dielectric 160 insulating the gate electrode 150 from other elements may be formed.

After which, photolithography and an etching process using a mask may be performed at a partial region of the lower insulation layer 160 and a partial region of the gate insulation layer 140. As a result, a contact hole 162 exposing a portion of a top of the active layer 130 is formed. Then, as illustrated in a portion (b) of FIG. 14, a conductive material is coated over the substrate and in the contact hole 162 (for example, a metal material is buried in the contact hole 162). Thereafter, a data electrode 170 may be formed by performing photolithography and an etching process using a mask. Thus, the data electrode 170 is electrically connected to the active layer 130, in the contact hole 162.

Figure 14:
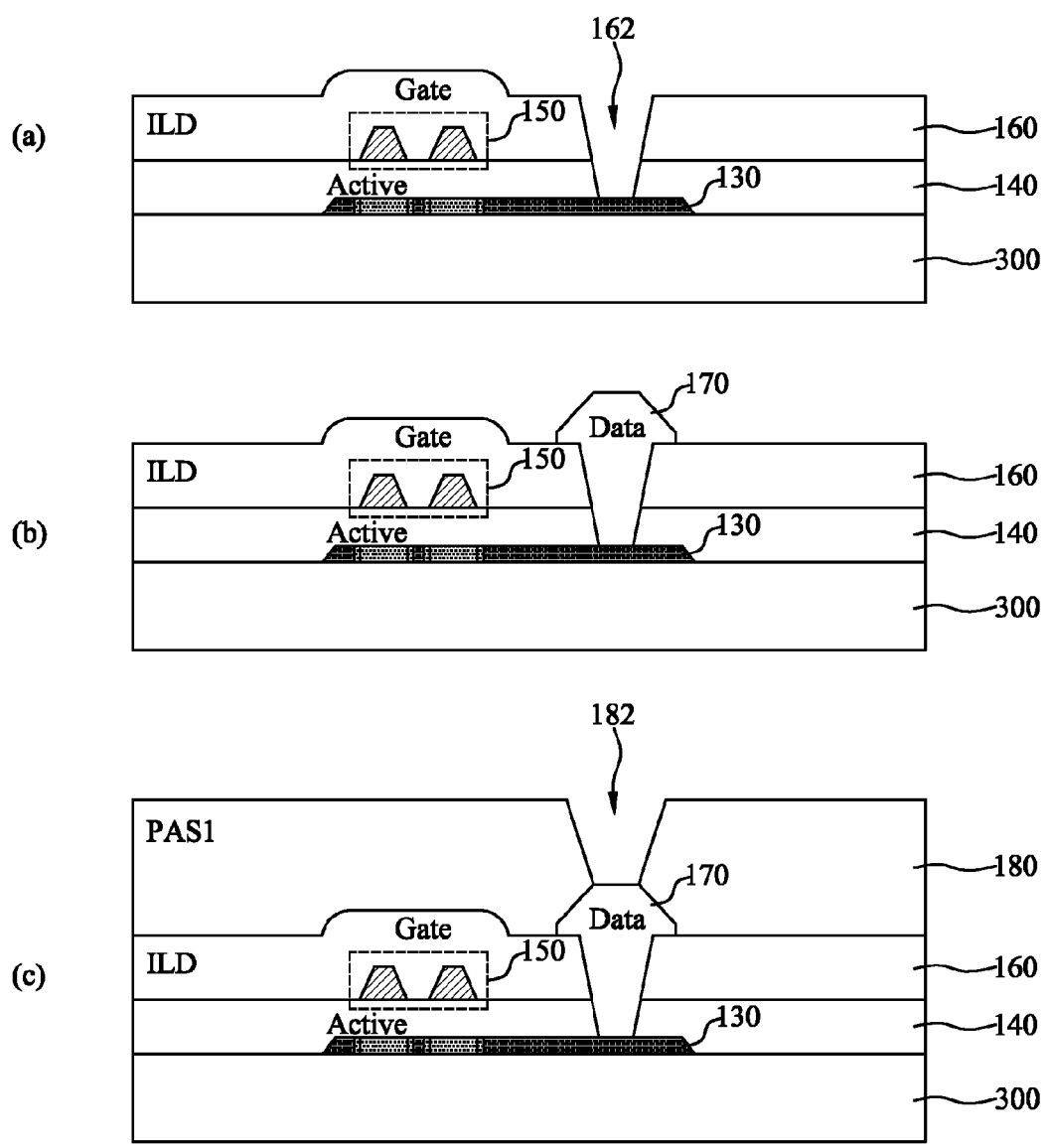

Subsequently, as illustrated in a portion (c) of FIG. 14, a first passivation layer 180 (PAS1) may be formed to cover the inter layer dielectric 160 and the data electrode 170. Then, photolithography and an etching process using a mask may be performed at a partial region of the first passivation layer 180 (PAS1). Thus, a first contact hole 182 exposing a portion of the data electrode 170 is formed.

Figure 15:
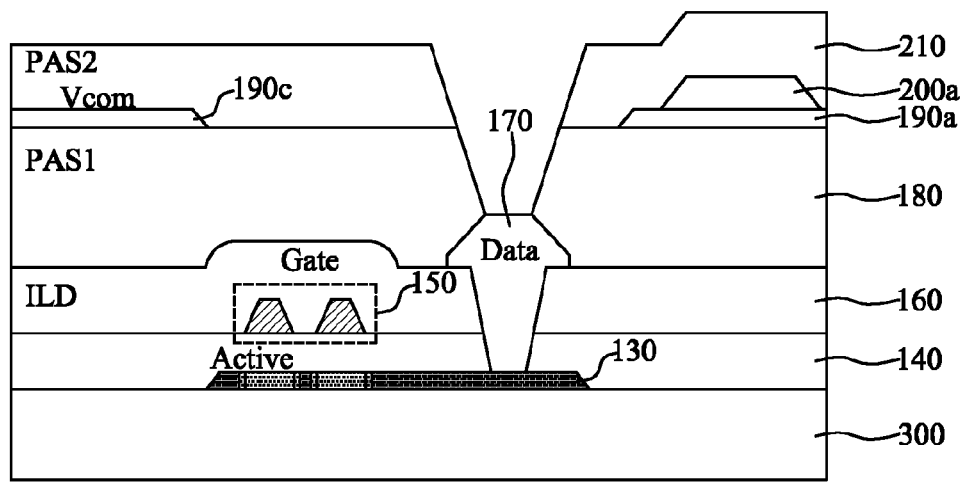
Figure 15:
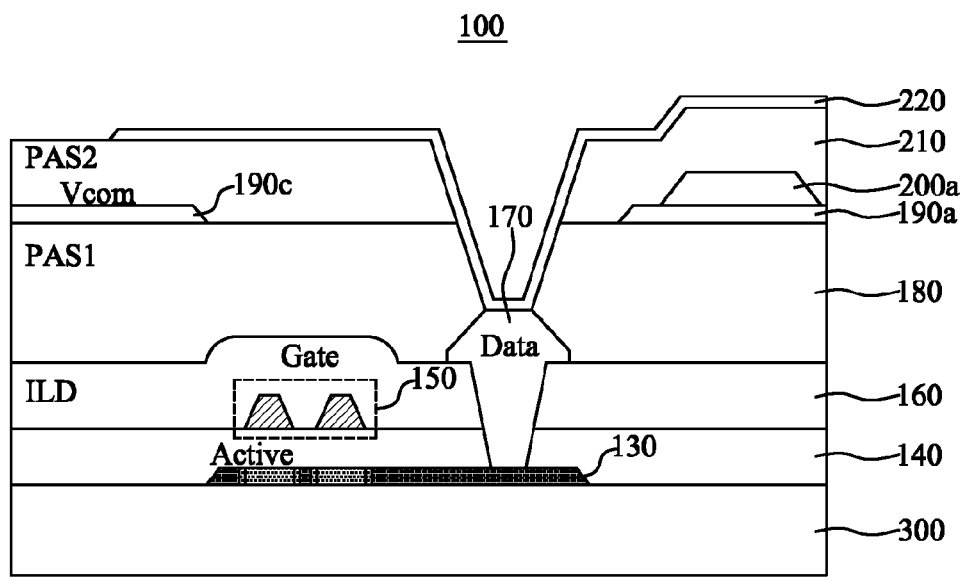

Thereafter, as illustrated in a portion (a) of FIG. 15, a transparent conductive material such as ITO may be deposited on the first passivation layer 180 (PAS1) and the first contact hole 182. Subsequently, a common electrode layer 190a, 190b may be formed by patterning a transparent conductive material that is deposited by photolithography and an etching process using a mask.

Then, a conductive material may be coated on the first passivation layer 180 and the common electrode layer 190a, 190c. Subsequently, the conductive material may be patterned by photolithography and an etching process using a mask. Therefore, a conductive line 200a is formed on the common electrode 190a. The common electrode 190a and the conductive line 200a are connected.

Subsequently, as illustrated in a portion (b) of FIG. 15, a second passivation layer 210 (PAS2) may be formed to cover the common electrode 190 and the conductive line 200. Thereafter, a contact hole may be formed at a partial region of the second passivation layer 210 (PAS2) by performing photolithography and an etching process using a mask. A top of the data electrode 170 is exposed by the contact hole.

A pixel electrode 220 (pixel ITO) may be formed of a transparent conductive material such as ITO, on the second passivation layer 210 and in the contact hole. The pixel electrode 220 may be electrically connected to the data electrode 170, in the contact hole.

In the above description, the active layer is doped in an n type, which merely illustrates an example. In another embodiment of the present disclosure, the active layer may be doped in a p type.

The method of manufacturing the LCD device according to the above-described embodiment of the present disclosure can increase the margin between the channel width and length (W/L) of the TFT having the multi-gate structure. Also, the method can increase exposure process margin in during the manufacture of the TFT having the multi-gate structure.

The method of manufacturing the LCD device according to the above-described embodiment of the present disclosure may removes the light shield layer that shields light incident on the active layer 130, and thus can decrease one mask step compared to the related art. Moreover, the method can reduce a fabrication process by about 12.2% relative to the related art (for example, reduce 155 steps to 136 steps). Accordingly, manufacturing costs can be saved, and the manufacturing efficiency can be enhanced.

The LCD device and the manufacturing method thereof according to the above-described embodiment apply LTPS as the active material of the lower substrate, thereby improving driving performance over a-Si.

In the above description, the TFT structure n is applied to the LCD device with built-in touch screen, which merely illustrates an example. The structure of the TFT including the multi-gate and the active layer may be applied to display devices other than LCD devices.

The present disclosure can increase a margin between the channel width and length (W/L) of the thin film transistor having the multi-gate structure and can increase exposure process margin during the manufacture of the thin film transistor having the multi-gate structure.

The present disclosure can decrease the mask process when forming the lower substrate, thereby saving the cost.

The present disclosure simplifies the process of manufacturing the lower substrate, thereby enhancing the manufacturing efficiency.

The present disclosure applies Low Temperature Poly Silicon (LTPS) as a material of the lower substrate, thereby enhancing driving performance.

It will be apparent to those skilled in the art that modifications and variations can be made in the present embodiments without departing from the spirit or scope of the disclosure. Thus, it is intended that the present disclosure covers the modifications and variations of this disclosure provided they come within the scope of the appended claims and their equivalents.

What is claimed is:

1. A method of manufacturing a Liquid Crystal Display (LCD) device, the method comprising:
    coating a semiconductor material on a substrate where a plurality of pixel regions are defined by data lines and gate lines;
    patterning the semiconductor material into an active layer at each of a plurality of pixel regions;
    forming an insulation layer on the active layer;
    coating a conductive material on the insulation layer;
    patterning a gate electrode with a plurality of multi-patterns overlapping with a partial region of the active layer;
    etching a partial region of the insulation layer to create a contact hole to expose a partial region of the active layer;
    burying a conductive material in the contact hole to form a data electrode which is electrically connected to the active layer; and
    doping a Lightly Doped Drain (LDD) around a plurality of channels formed by the active layer and the multi-patterns which overlap with each other with the insulation layer therebetween,
    wherein the multi-patterns are formed with straight edges by compensating pattern distortion of an edge portion of a gate pattern, and formed with the gate pattern which is designed to comprise a plurality of compensation patterns.

2. The method according to claim 1, wherein the compensation patterns comprise a positive compensation pattern and a negative compensation pattern.

3. The method according to claim 2, wherein:
    the multi-patterns comprise:
    a first multi-pattern protruding perpendicularly from the gate line; and
    a second multi-pattern protruding perpendicularly from the first multi-pattern, and
    pattern compensation for an end edge portion of the first multi-pattern and an end edge portion of the second multi-pattern is performed by the positive compensation pattern.

4. The method according to claim 3, wherein pattern compensation for a portion where the first multi-pattern and the second multi-pattern branch from each other is performed by the negative compensation pattern.

5. The method according to claim 3, wherein the forming of a gate electrode comprises:
    forming a first multi-pattern perpendicularly from the gate line; and
    forming a second multi-pattern to perpendicularly from the first multi-pattern.

* * * * *